(12) United States Patent
Moheban et al.

(10) Patent No.: US 11,159,148 B1
(45) Date of Patent: Oct. 26, 2021

(54) HYBRID FIFO BUFFER

(71) Applicant: Marvell Israel (M.I.S.L) Ltd., Yokne'am (IL)

(72) Inventors: Lior Moheban, Nes Zionna (IL); Alex Pinskiy, Ashkelon (IL); Yakov Tokar, Rishon LeZion (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 101 days.

(21) Appl. No.: 16/773,522

(22) Filed: Jan. 27, 2020

Related U.S. Application Data

(60) Provisional application No. 62/821,316, filed on Mar. 20, 2019, provisional application No. 62/798,231, filed on Jan. 29, 2019.

(51) Int. Cl.
  *H03K 3/037* (2006.01)
(52) U.S. Cl.
  CPC .................................. *H03K 3/037* (2013.01)
(58) Field of Classification Search
  CPC .................................................... H03K 3/037
  See application file for complete search history.

(56) References Cited

U.S. PATENT DOCUMENTS

| | | | |
|---|---|---|---|
| 7,796,652 B2 * | 9/2010 | Reitlingshoefer | H04L 7/033 370/535 |
| 10,193,831 B2 | 1/2019 | Peled et al. | |
| 10,621,122 B1 * | 4/2020 | Moheban | H03K 3/356017 |

* cited by examiner

*Primary Examiner* — Patrick O Neill

(57) ABSTRACT

A first-in/first-out (FIFO) buffer includes at least one latch-based FIFO storage line, an input flip-flop stage upstream of the at least one latch-based storage line, an output flip-flop stage downstream of the at least one latch-based storage line. The output flip-flop stage functions as an additional storage line. Clock-gating circuitry separate from the device clock controls timing of the at least one latch-based FIFO storage line, the input flip-flop stage, and the output flip-flop stage. The input flip-flop stage functions as a second additional storage line, or as an input sampling stage. Optional bypass circuitry between the input flip-flop stage and the output flip-flop stage passes data for a storage line directly to the output flip-flop stage, without passing through the at least one latch-based storage line, when the buffer is empty.

22 Claims, 5 Drawing Sheets

HYBRID FIFO BUFFER

CROSS REFERENCE TO RELATED APPLICATIONS

This disclosure claims the benefit of commonly-assigned U.S. Provisional Patent Applications Nos. 62/798,231, filed Jan. 29, 2019, and 62/821,316, filed Mar. 20, 2019, each of which is hereby incorporated by reference herein in its respective entirety.

FIELD OF USE

This disclosure relates to a latch-based FIFO buffer. More particularly, this disclosure relates to a hybrid latch-based FIFO buffer that also includes flip-flop-based stages.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

A First-In/First-Out (FIFO) buffer is a type of storage used to hold data temporarily as it moves from one device to another, or from one portion of a device to another portion of a device, especially where the source and destination operate at different clock rates and the destination cannot accept the data as fast as the source can transmit the data. As the name suggests, the oldest data in the FIFO (i.e., the first data to enter the FIFO) is the first data to exit the FIFO, but the writing and reading can be asynchronous, meaning that data can be written and read at different rates.

FIFO buffers are frequently implemented using flip-flops, which operate synchronously, writing and reading data based on a system clock. However, flip-flops have relatively high power consumption, and also occupy a relatively large amount of device area, which can be an issue in some devices, such as network switches, that move large amounts of data and therefore include large numbers—e.g., thousands—of FIFOs.

FIFO buffers may alternatively be implemented using latches, which are smaller and consume less power than flip-flops. However, the transparent nature of latches causes timing issues. Additionally, the latches cannot be included in scan chain testing.

SUMMARY

A first-in/first-out (FIFO) buffer according to implementations of the subject matter of this disclosure, for use in a device having a device clock, includes at least one latch-based FIFO storage line, an input flip-flop stage upstream of the at least one latch-based FIFO storage line, an output flip-flop stage downstream of the at least one latch-based FIFO storage line, the output flip-flop stage being configured to function as a first additional FIFO storage line, and clock-gating circuitry separate from the device clock, and configured to control timing of the at least one latch-based FIFO storage line, the input flip-flop stage, and the output flip-flop stage.

In a first implementation of such a FIFO buffer, the input flip-flop stage may be configured to function as a second additional FIFO storage line.

In a second implementation of such a FIFO buffer, the input flip-flop stage may be configured to function as an input sampling stage.

A third implementation of such a FIFO buffer may further include bypass circuitry between the input flip-flop stage and the output flip-flop stage, the bypass circuitry being configured to pass data for a FIFO storage line directly to the output flip-flop stage, without passing through the at least one latch-based storage line, when the FIFO buffer is empty.

In a variant of that third implementation, the bypass circuitry may include logic configured to determine when to pass data for a FIFO storage line directly to the output flip-flop stage, without passing through the at least one latch-based storage line, when the FIFO buffer is empty.

In that variant, the logic configured to determine when to pass data for a FIFO storage line directly to the output flip-flop stage when the FIFO buffer is empty may include a multiplexer controlled by a signal that indicates a fill level of the FIFO buffer.

In a fourth implementation of such a FIFO buffer, each FIFO storage line may include a first number count of bits, and each of the at least one latch-based FIFO storage line may include a second number count of single-bit latches, the second number count being equal to the first number count.

In that fourth implementation, each of the input flip-flop stage and the output flip-flop stage, respectively, may include a third number count of single-bit flip-flops, the third number count being equal to the first number count and the second number count.

In a fifth implementation of such a FIFO buffer, clock-gating circuitry configured to control timing of the at least one latch-based FIFO storage line, the input flip-flop stage, and the output flip-flop stage may be configured to control timing of the at least one latch-based FIFO storage line, the input flip-flop stage, and the output flip-flop stage based on a combination of signals including at least one of a signal indicating whether the FIFO buffer is full, a signal indicating whether a subsequent FIFO buffer is ready to receive data, and a signal indicating whether a previous FIFO buffer is ready to send data.

In a first variant of that fifth implementation, the clock-gating circuitry may be configured to control timing of the output flip-flop stage based on at least the signal indicating whether the subsequent FIFO buffer is ready to receive data.

In a second variant of that fifth implementation, the clock-gating circuitry may be configured to control timing of the input flip-flop stage based on a combination of at least the signal indicating whether the FIFO buffer is full and the signal indicating whether a previous FIFO buffer is ready to send data.

In a third variant of that fifth implementation, the clock-gating circuitry may be configured to control timing of the at least one latch-based FIFO storage line based on a combination of signals including at least the signal indicating whether the FIFO buffer is full, the signal indicating whether a subsequent FIFO buffer is ready to receive data, and the signal indicating whether a previous FIFO buffer is ready to send data.

A fourth variant of that fifth implementation may further include write pointer circuitry and read pointer circuitry configured to determine location of data in the at least one latch-based storage line. That fourth variant may further include a latch-select multiplexer controlled by the read pointer.

A fourth variant of that fifth implementation may further include bypass circuitry between the input flip-flop stage and the output flip-flop stage, the bypass circuitry being configured to pass data for a FIFO storage line directly to the output flip-flop stage, without passing through the at least one latch-based storage line, when the FIFO buffer is empty.

In that fourth variant, the bypass circuitry may include logic configured to determine when to pass data for a FIFO storage line directly to the output flip-flop stage, without passing through the at least one latch-based storage line, when the FIFO buffer is empty. The logic configured to determine when to pass data for a FIFO storage line directly to the output flip-flop stage when the FIFO buffer is empty may include a multiplexer controlled by a signal that indicates a fill level of the FIFO buffer.

A method according to implementations of the subject matter of this disclosure of operating a first-in/first-out (FIFO) buffer for use in a device having a device clock, the FIFO buffer including at least one latch-based FIFO storage line, an input flip-flop stage upstream of the at least one latch-based FIFO storage line, and an output flip-flop stage downstream of the at least one latch-based FIFO storage line, includes controlling timing of the at least one latch-based FIFO storage line, the input flip-flop stage, and the output flip-flop stage with a clock-gating signal separate from the device clock, and when the FIFO buffer is empty, storing an initial FIFO storage line in the output flip-flop stage.

In a first implementation of such a method, the storing an initial FIFO storage line in the output flip-flop stage may include bypassing the input flip-flop stage and the at least one latch-based FIFO storage line.

A second implementation of such a method may further include storing an additional FIFO storage line in the input flip-flop stage.

A third implementation of such a method may include using the input flip-flop stage as an input sampling stage.

In a fourth implementation of such a method, the controlling timing of the at least one latch-based FIFO storage line, the input flip-flop stage, and the output flip-flop stage with a clock-gating signal separate from the device clock may include controlling timing of the at least one latch-based FIFO storage line, the input flip-flop stage, and the output flip-flop stage based on a combination of signals including at least one of a signal indicating whether the FIFO buffer is full, a signal indicating whether a subsequent FIFO buffer is ready to receive data, and a signal indicating whether a previous FIFO buffer is ready to send data.

In a first variant of the fourth implementation, controlling timing of the output flip-flop stage may include controlling timing of the output flip-flop stage based on at least the signal indicating whether the subsequent FIFO buffer is ready to receive data.

In a second variant of the fourth implementation, controlling timing of the input flip-flop stage may include controlling timing of the input flip-flop stage based on a combination of at least the signal indicating whether the FIFO buffer is full and the signal indicating whether a previous FIFO buffer is ready to send data.

In a third variant of the fourth implementation, controlling timing of the at least one latch-based FIFO storage line may include controlling timing of the at least one latch-based FIFO storage line based on a combination of signals including at least the signal indicating whether the FIFO buffer is full, the signal indicating whether a subsequent FIFO buffer is ready to receive data, and the signal indicating whether a previous FIFO buffer is ready to send data.

A fifth implementation of such a method may include determining location of data in the at least one latch-based storage line using a write pointer and a read pointer.

In a sixth implementation of such a method, the storing an initial FIFO storage line in the output flip-flop stage when the FIFO buffer is empty may include passing data for the initial FIFO storage line directly to the output flip-flop stage, without passing through the at least one latch-based storage line, when the FIFO buffer is empty.

In that sixth variant, the passing data for the initial FIFO storage line directly to the output flip-flop stage, without passing through the at least one latch-based storage line, when the FIFO buffer is empty, may include controlling a multiplexer, with a signal that indicates a fill level of the FIFO buffer, to select bypass circuitry configured to pass data directly to the output flip-flop stage.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
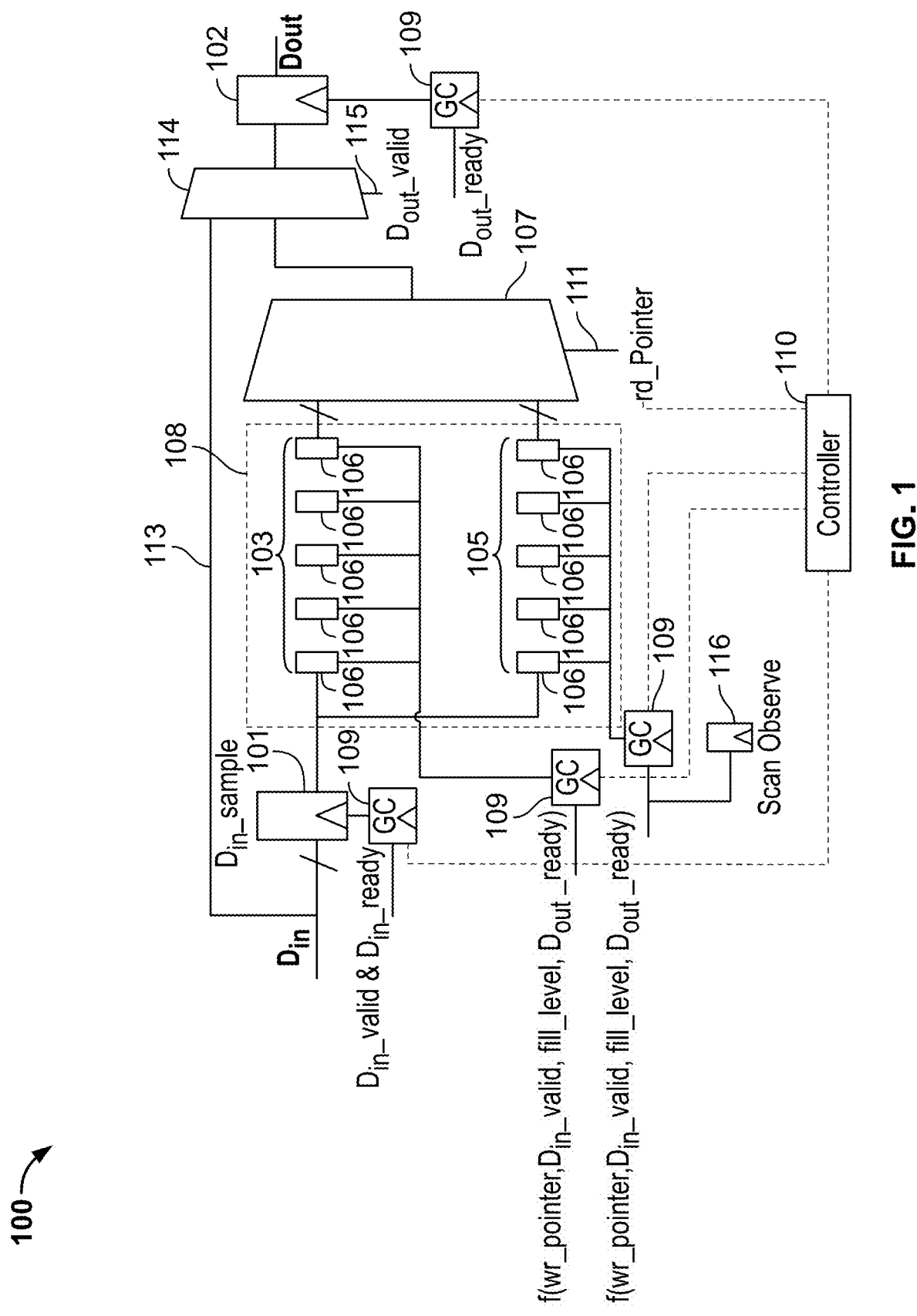
FIG. 1 is a schematic representation of a FIFO buffer in accordance with a first implementation of the subject matter of this disclosure.

As noted above, FIFO buffers may be implemented using latches, which are smaller and consume less power than flip-flops. However, latches operate transparently, in that the output of a latch changes very soon after the input of the latch changes, when the device clock signal is high. Therefore, if an input signal arrives while the clock is low, the input signal is held until the clock is high, but if an input signal arrives while the clock is high, it passes right through the latch. The transparent nature of latches causes timing issues, and also means that the latches cannot be included in scan chain testing in situations where the device is tested by AC and DC scan chain testing rather than a built-in self-test (BIST) engine. One known solution to both the timing and scanning issues is to "wrap" a latch-based FIFO in flip-flops—i.e., to provide a flip-flop immediately before the latch-based FIFO and a flip-flop immediately after the latch-based FIFO. Those "wrapper" flip-flops are clocked by the device clock, while the latches in the FIFO are transparent during half of each clock cycle. Therefore, the combination of the latch-based FIFO and the flip-flop "wrapper" mitigates any timing and scanning issues.

However, such a solution adds additional flip-flops to any device including a FIFO. In large devices such as, e.g., network switches, there can be thousands of FIFOs encompassing millions of data bits, and adding two flip-flops per FIFO significantly increases device area and power consumption.

In accordance with implementations of the subject matter of this disclosure, a FIFO is provided that uses latches for at least some of the FIFO storage lines, but uses flip-flops for others of the FIFO storage lines and includes flip-flops as the first and last elements of the FIFO. The flip-flops used as the first and last elements of the FIFO are similar to the aforementioned flip-flop wrapper in mitigating timing and scanning issues, but unlike the aforementioned flip-flop wrapper, in which the flip-flops are not part of the FIFO and are gated by the general device clock, the flip-flops used as the first and last elements of the FIFO are gated by FIFO control signals, as described in more detail below.

In implementations of the subject matter of this disclosure, the final flip-flop—i.e., the flip-flop at the output end of the FIFO—is used as the first FIFO storage line. In some such implementations, the initial flip-flop—i.e., the flip-flop at the input end of the FIFO—is used as the final FIFO storage line. However, in other such implementations, where timing is more critical, to prevent timing issues related to propagation of data from the initial flip-flop to the final flip-flop, the initial flip-flop may be used as a sampling stage rather than as one of the FIFO storage lines, while still being gated by the FIFO control signals.

In any of the foregoing implementations, the FIFO may include a bypass line from the initial flip-flop to the final flip-flop that is used when the FIFO is empty to allow the first storage line to be loaded directly into the final flip-flop. However, the bypass line may be omitted, in which case minimal latency of one extra clock cycle will be incurred before the first storage line is available at the final flip-flop.

Although the initial and final flip-flops have been referred to in the singular, in this description and in the claims which follow each may be interpreted as including a plurality of single-bit flip-flops where the plurality is equal to the number of bits in one FIFO storage line. Alternatively, each of the initial and final flip-flops may be a single multi-bit flip-flop having a plurality of bits equal to the number of bits in one FIFO storage line.

In addition, while the implementations described below include the initial and final flip-flops and use latches for all other FIFO storage lines, in other implementations (not shown), there may be additional flip-flops used as storage lines in the FIFO. In such other implementations, the additional flip-flops would be before the latch-based FIFO storage lines and/or after the latch-based FIFO storage lines, but there would not be flip-flop-based storage lines between latch-based storage lines.

A FIFO, generally, may be characterized by the following input signals and output signals:

| Signal Name | Signal Type | Function |
| --- | --- | --- |
| fill_level | Internal | Count (maintained in an internal register) of the number of lines of the FIFO, out of N total lines, that are occupied |
| clk | Input | Clock |
| $D_{in}$ | Input | Data bus input to the FIFO |
| $D_{out}$ | Output | Data bus output from the FIFO |
| $D_{in}$_valid | Input | Indication from an immediately upstream FIFO or other immediately upstream source that the immediately upstream source has output data ready to be sampled; if immediately upstream source is another FIFO, this is the |

-continued

| Signal Name | Signal Type | Function |
| --- | --- | --- |
| | | $D_{out}$_valid (see below) of that upstream FIFO |
| $D_{in}$_ready | Output | Signal to immediately upstream source that FIFO is ready to receive data; will be '1' as long as fill_level ≠ N |
| $D_{out}$_valid | Output | Indication to an immediately downstream FIFO or other immediately downstream destination that the FIFO has output data ready to be sampled; will be '1' if fill_level > 0 |
| $D_{out}$_ready | Input | Signal from immediately downstream destination that immediately downstream destination is ready to receive data; if immediately downstream destination is another FIFO, this is the $D_{in}$_ready (see above) of that downstream FIFO |

Four implementations of FIFO buffers in accordance with this disclosure are described below. For ease of illustration, each implementation is a four-line FIFO with five bits per line. However, in an actual device, the number of lines, as well as the number of bits per line, may be substantially greater. In each implementation, there is a system clock (not shown) in addition to the control signals that are illustrated.

As noted above, in some implementations the initial flip-flop may be used as one of the FIFO lines, while in other implementations the initial flip-flop may be used only as a sampling stage. Therefore, in order to show all implementations with the same number of lines, the number of latch-based FIFO lines is smaller in the implementations in which the initial flip-flop is used as one of the FIFO lines. In alternative implementations (not shown), the number of latch-based FIFO lines could have been kept constant, in which case the total number of FIFO lines would differ among the implementations.

FIG. 1 shows a four-line FIFO 100, in accordance with a first implementation of the subject matter of this disclosure, in which the initial flip-flop 101 is used as one of the FIFO lines. The final flip-flop 102 also is used as one of the FIFO lines. Additional FIFO lines are provided as latch-based FIFO lines 103 and 105. As illustrated, each latch-based FIFO line 103, 105 is a five-bit line including five one-bit latches 106. Each of flip-flop 101 and flip-flop 102 also is a five-bit FIFO line. This can be accomplished by using a respective five-bit flip-flop as each of flip-flops 101, 102, or by providing five instances (not shown) of a one-bit flip-flop as each of flip-flops 101, 102.

Output flip-flop 102 holds the current "first" FIFO line, which is the next one to be read out. The data for each FIFO line is read into input flip-flop 101. When FIFO 100 is initially empty, the first data line is conducted directly from input flip-flop 101 to output flip-flop 102 via bypass line 113 under the control of bypass multiplexer 114. The logic control signal 115 for bypass multiplexer 114 may be $D_{out}$_valid, which, based on the description above, would be '0' when FIFO 100 is empty. Thus, bypass multiplexer 114 could select bypass line 113 when logic control signal 115 is '0', and could otherwise select the output of latch-select multiplexer 107.

Output flip-flop 102 is gated by gated clock element 109, which is a conventional gated clock element, controlled to output its data content by the $D_{out}$_ready input received from the next downstream destination.

Input data $D_{in}$, in addition to being input to bypass multiplexer 114 on bypass line 113, is input to input flip-flop 101, which is gated by gated clock element 109, which is a conventional gated clock element, controlled by $D_{in}$_valid and $D_{in}$_ready. When $D_{in}$_valid indicates that the immediately upstream source has data, and $D_{in}$_ready indicates that FIFO 100 is not full, gated clock element 109 clocks that data into input flip-flop 101, and also clocks any data that was present in input flip-flop 101 into latch-based FIFO lines 108.

Each latch-based FIFO line 103, 105 in latch-based FIFO lines 108 is gated by a respective gated clock element 109, which is a conventional gated clock element, controlled by a function, f, of $D_{in}$_valid, the fill_level, $D_{out}$_ready, and a write pointer (wr_pointer). As data advances through FIFO 100, it physically moves from input flip-flop 101 to latch-based FIFO lines 108, and from latch-based FIFO lines 108 to output flip-flop 102. However, in some implementations, within latch-based FIFO lines 108, the data does not actually move from one of latch-based FIFO lines 103, 105 to another of latch-based FIFO lines 103, 105. Rather, controller 110 keeps track of which of latch-based FIFO lines 103, 105 should be written to next and adjusts the write pointer (wr_pointer) accordingly to control, via gated clock elements 109, where the data is written. Similarly, controller 110 keeps track of which of latch-based FIFO lines 103, 105 should be read out next and adjusts read pointer (rd_pointer) 111 accordingly to control latch-select multiplexer 107 to select the correct one of latch-based FIFO lines 103, 105 for reading.

Figure 2:
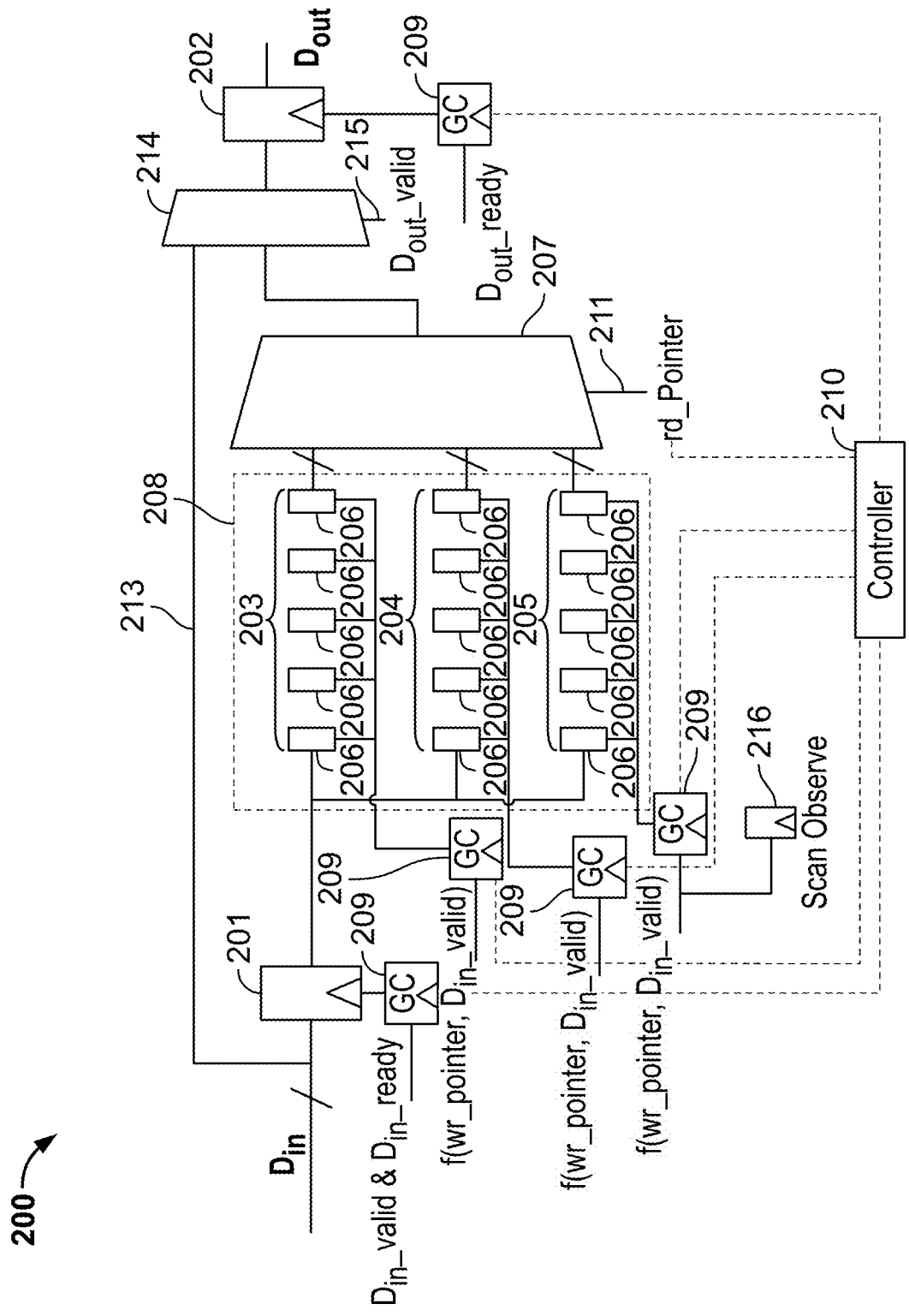
FIG. 2 is a schematic representation of a FIFO buffer in accordance with a second implementation of the subject matter of this disclosure.

FIG. 2 shows a four-line FIFO 200, in accordance with a first implementation of the subject matter of this disclosure, in which the initial flip-flop 201 is not used as one of the FIFO lines, but rather as a sampling stage. This implementation may be used in high-frequency applications in which data cannot propagate sufficiently quickly from initial flip-flop 201 to final flip-flop 202 through latch-based FIFO lines 208 to meet timing requirements, because latch-based FIFO lines 208 cannot be read from and written to at the same time. Therefore, in order to provide four lines in FIFO 200, latch-based FIFO lines 208 includes three latch-based FIFO lines 203, 204, 205 instead of only two latch-based FIFO lines 103, 105 as in FIFO 100.

FIFO 200 otherwise operates similarly to FIFO 100. The final flip-flop 202 is used as one of the FIFO lines. As illustrated, each latch-based FIFO line 203, 204, 205 is a five-bit line including five one-bit latches 206. Flip-flop 202 also is a five-bit FIFO line. This can be accomplished by using a five-bit flip-flop as flip-flop 202, or by providing five instances (not shown) of a one-bit flip-flop as flip-flop 202.

Output flip-flop 202 holds the current "first" FIFO line, which is the next one to be read out. The data for each FIFO line is read into input flip-flop 201. When FIFO 200 is initially empty, the first data line is conducted directly from input flip-flop 201 to output flip-flop 202 via bypass line 213 under the control of bypass multiplexer 214. The logic control signal 215 for bypass multiplexer 214 may be $D_{out}$_valid, which, based on the description above, would be '0' when FIFO 200 is empty. Thus, bypass multiplexer 214 could select bypass line 213 when logic control signal 215 is '0', and could otherwise select the output of latch-select multiplexer 207.

Output flip-flop 202 is gated by gated clock element 209, which is a conventional gated clock element, controlled to output its data content by the $D_{out}$_ready input received from the next downstream destination.

Input data $D_{in}$, in addition to being input to bypass multiplexer 214, is input to input flip-flop 201, which is gated by gated clock element 209, which is a conventional gated clock element, controlled by $D_{in}$_valid and $D_{in}$_ready. When $D_{in}$_valid indicates that the immediately upstream source has data, and $D_{in}$_ready indicates that FIFO 200 is not full, gated clock element 209 makes a logical selection, based on those signals, to clock that data into input flip-flop 201, after clocking any data that was present in input flip-flop 201 into latch-based FIFO lines 208.

Each latch-based FIFO line 203, 204 205 in latch-based FIFO lines 208 is gated by a respective gated clock element 209, which is a conventional gated clock element, controlled by a function, f, of $D_{in}$_valid, the fill_level, $D_{out}$_ready, and a write pointer (wr_pointer). As data advances through FIFO 200, it physically moves from input flip-flop 201 to latch-based FIFO lines 208, and from latch-based FIFO lines 208 to output flip-flop 202. However, within latch-based FIFO lines 208, the data does not actually move from one of latch-based FIFO lines 203, 204, 205 to another of latch-based FIFO lines 203, 204, 205. Rather, controller 210 keeps track of which of latch-based FIFO lines 203, 204, 205 should be written to next and adjusts the write pointer (wr_pointer) accordingly to control, via gated clock elements 209, where the data is written. Similarly, controller 210 keeps track of which of latch-based FIFO lines 203, 204, 205 should be read out next and adjusts read pointer (rd_pointer) 211 accordingly to control latch-select multiplexer 207 to select the correct one of latch-based FIFO lines 203, 204, 205 for reading to output flip-flop 202.

Figure 3:
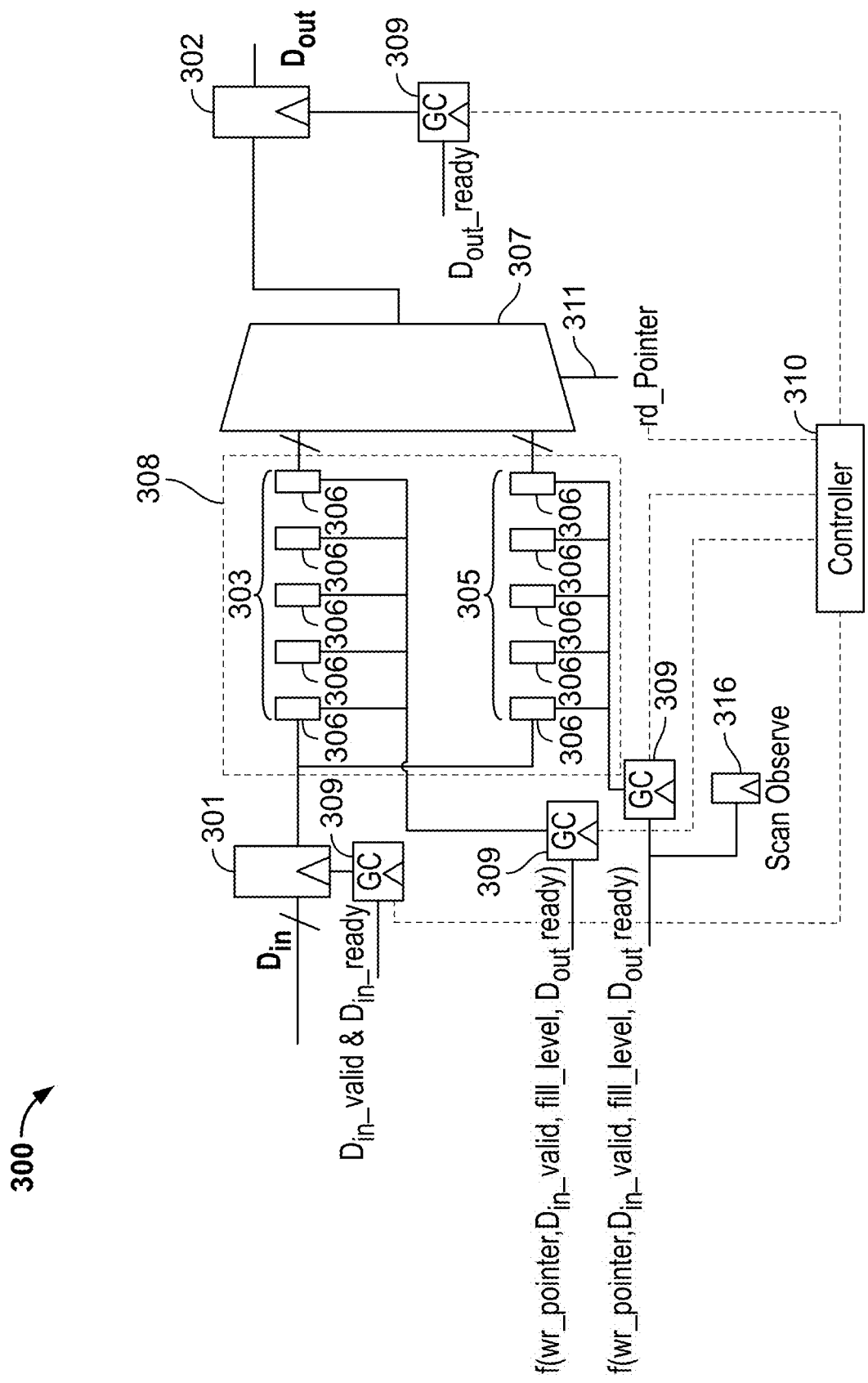
FIG. 3 is a schematic representation of a FIFO buffer in accordance with a third implementation of the subject matter of this disclosure.

FIFO 300 of FIG. 3 is similar to FIFO 100 of FIG. 1 in that input flip-flop 301 is used as one of the FIFO lines, as is output flip-flop 302, but FIFO 300 lacks bypass line 113 and bypass multiplexer 114. Accordingly, there may be a slight penalty when reading of the first FIFO line is called for within one or two clock cycles of when the data in the first FIFO line is written to input flip-flop 301, because it will take at least one additional clock cycle for the data to propagate to output flip-flop 302 through latch-based FIFO lines 308. In most applications, this one or two clock cycle penalty is acceptable.

FIFO 300 otherwise operates similarly to FIFO 100. The initial flip-flop 301 is used as one of the FIFO lines. The final flip-flop 302 also is used as one of the FIFO lines. Additional FIFO lines are provided as latch-based FIFO lines 303 and 305. As illustrated, each latch-based FIFO line 303, 305 is a five-bit line including five one-bit latches 306. Each of flip-flop 301 and flip-flop 302 also is a five-bit FIFO line. This can be accomplished by using a respective five-bit flip-flop as each of flip-flops 301, 302, or by providing five instances (not shown) of a one-bit flip-flop as each of flip-flops 301, 302.

Output flip-flop 302 holds the current "first" FIFO line, which is the next one to be read out. The data for each FIFO line is read into input flip-flop 301. Input data $D_{in}$ is input to input flip-flop 301, which is gated by gated clock element 309, which is a conventional gated clock element, controlled by $D_{in}$_valid and $D_{in}$_ready. When $D_{in}$_valid indicates that the immediately upstream source has data, and $D_{in}$_ready indicates that FIFO 300 is not full, gated clock element 309 clocks that data into input flip-flop 301, and also clocks any data that was present in input flip-flop 301 into latch-based FIFO lines 308.

Each latch-based FIFO line 303, 305 in latch-based FIFO lines 308 is gated by a respective gated clock element 309, which is a conventional gated clock element, controlled by a function, f, of $D_{in}$_valid, the fill_level, $D_{out}$_ready, and a write pointer (wr_pointer). As data advances through FIFO 300, it physically moves from input flip-flop 301 to latch-based FIFO lines 308, and from latch-based FIFO lines 308 to output flip-flop 302. However, within latch-based FIFO lines 308, the data does not actually move from one of latch-based FIFO lines 303, 305 to another of latch-based FIFO lines 303, 305. Rather controller 310 keeps track of which of latch-based FIFO lines 303, 305 should be written to next and adjusts the write pointer (wr_pointer) accordingly to control, via gated clock elements 309, where the data is written. Similarly, controller 310 keeps track of which of latch-based FIFO lines 303, 305 should be read out next and adjusts read pointer (rd_pointer) 311 accordingly to control latch-select multiplexer 307 to select the correct one of latch-based FIFO lines 303, 305 for reading.

Output flip-flop 302 is gated by gated clock element 309, which is a conventional gated clock element, controlled to output its data content by the $D_{out}$_ready input received from the next downstream destination.

Figure 4:
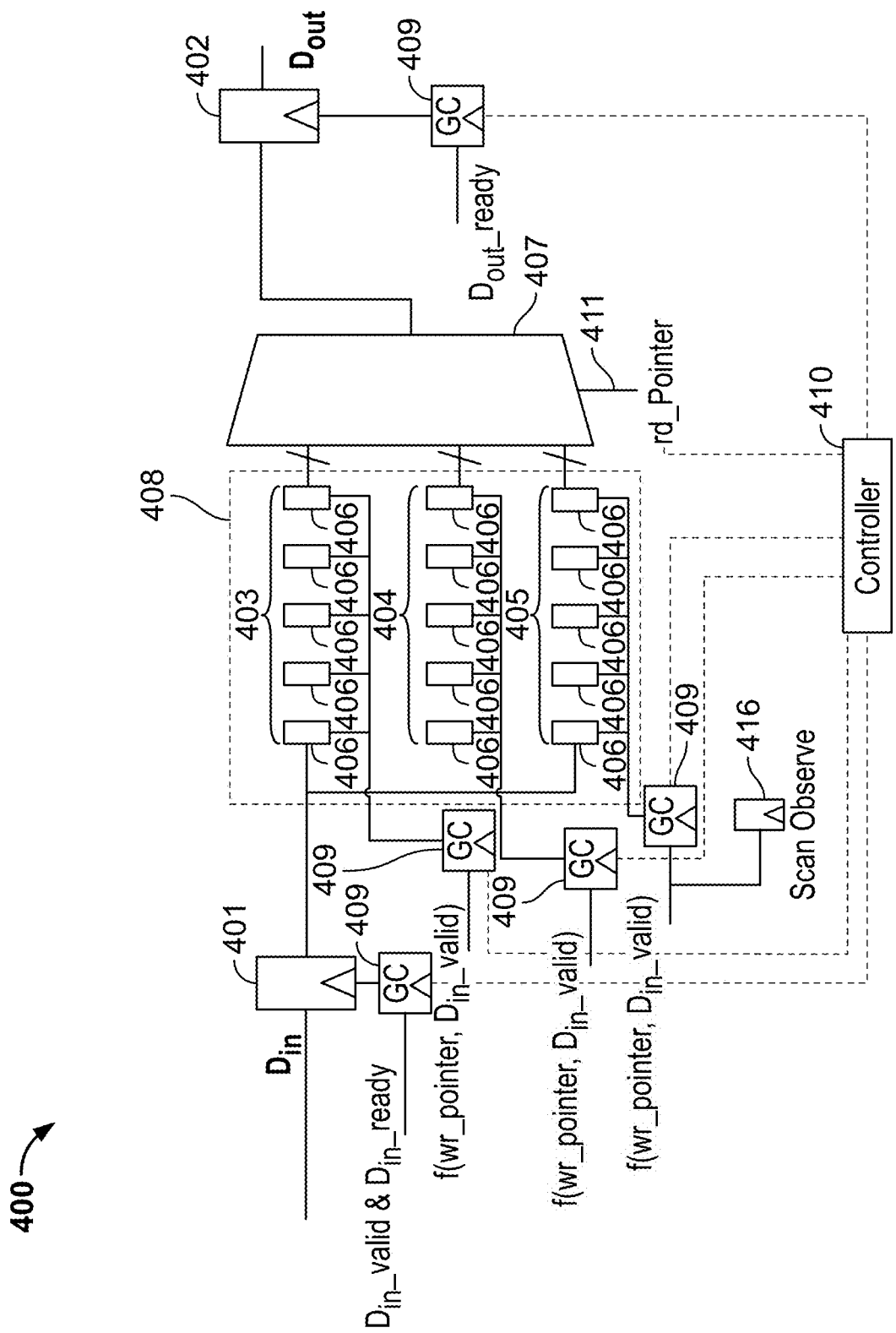
FIG. 4 is a schematic representation of a FIFO buffer in accordance with a fourth implementation of the subject matter of this disclosure.

FIFO 400 of FIG. 4 is similar to FIFO 200 of FIG. 2 in that input flip-flop 401 is used as an input sample stage and not as one of the FIFO lines, while output flip-flop 402 is used as one of the FIFO lines. However, like FIFO 300, FIFO 400 lacks bypass line 213 and bypass multiplexer 214. Accordingly, there may be a slight penalty when reading of the first FIFO line is called for within one or two clock cycles of when the data in the first FIFO line is written to input flip-flop 401, because it will take at least one additional clock cycle for the data to propagate to output flip-flop 402 through latch-based FIFO lines 408. In most applications, this one or two clock cycle penalty is acceptable.

FIFO 400 otherwise operates similarly to FIFO 200. The final flip-flop 402 is used as one of the FIFO lines, but initial flip-flop 401 is used only as a sampling stage. This implementation may be used in high-frequency applications in which data cannot propagate sufficiently quickly from initial flip-flop 401 to final flip-flop 402 through latch-based FIFO lines 408 to meet timing requirements, because latch-based FIFO lines 408 cannot be read from and written to at the same time. Therefore, in order to provide four lines in FIFO 400, latch-based FIFO lines 408 includes three latch-based FIFO lines 403, 404, 405 instead of only two latch-based FIFO lines 303, 305 as in FIFO 300. As illustrated, each latch-based FIFO line 403, 404, 405 is a five-bit line including five one-bit latches 406. Flip-flop 402 also is a five-bit FIFO line. This can be accomplished by using a five-bit flip-flop as flip-flop 402, or by providing five instances (not shown) of a one-bit flip-flop as flip-flop 402.

Output flip-flop 402 holds the current "first" FIFO line, which is the next one to be read out. Input data $D_{in}$, the input data for each FIFO line, is read into input flip-flop 401, which is gated by gated clock element 409, which is a conventional gated clock element, controlled by $D_{in}$_valid and $D_{in}$_ready. When $D_{in}$_valid indicates that the immediately upstream source has data, and $D_{in}$_ready indicates that FIFO 400 is not full, gated clock element 409 clocks that data into input flip-flop 401, and also clocks any data that was present in input flip-flop 401 into latch-based FIFO lines 408.

Each latch-based FIFO line 403, 404, 405 in latch-based FIFO lines 408 is gated by a respective gated clock element 409, which is a conventional gated clock element, controlled by a function, f, of $D_{in}$_valid, the fill_level, $D_{out}$_ready, and a write pointer (wr_pointer). As data advances through FIFO 400, it physically moves from input flip-flop 401 to latch-based FIFO lines 408, and from latch-based FIFO lines 408 to output flip-flop 402. However, within latch-based FIFO lines 408, the data does not actually move from one of latch-based FIFO lines 403, 404, 405 to another of latch-based FIFO lines 403, 404, 405. Rather, controller 410 keeps track of which of latch-based FIFO lines 403, 404, 405 should be written to next and adjusts the write pointer (wr_pointer) accordingly to control, via gated clock elements 409, where the data is written. Similarly, controller 410 keeps track of which of latch-based FIFO lines 403, 404, 405 should be read out next and adjusts read pointer (rd_pointer) 411 accordingly to control latch-select multiplexer 407 to select the correct one of latch-based FIFO lines 403, 404, 405 for reading out to output flip-flop 402.

Output flip-flop 402 is gated by gated clock element 409, which is a conventional gated clock element, controlled to output its data content by the $D_{out}$_ready input received from the next downstream destination.

Each of the four structures described above avoids the disadvantages previously noted in connection with the use of a FIFO buffer based only on latch-based FIFO memory elements. The device in which the FIFO structure is used communicates only with the $D_{in}$ and $D_{out}$ flip-flops. There are no scan chain testing issues on the data paths, which pass, by simple combinational logic, through the latches, from the $D_{in}$ flip-flop to the $D_{out}$ flip-flop. The latches are not scannable, and are transparent during the scan capture phase, so they do not affect the scan chain testing.

Similarly, with regard to faults on the latch clock pins, the path that checks the latch clock pins starts at a flip-flop that drives the CG enable signal, passes through the latch clock pin, and is sampled at the $D_{out}$ flip-flop. This path is too complex for scan chain testing, so observation flip-flops 116, 216, 316, 416 are added to the CG enable pins.

With regard to timing issues, there is no logic between the $D_{in}$ flip-flop and the latches. Therefore, even though the path between the $D_{in}$ flip-flop and the latches is a half-cycle path because of the nature of latch operation (from a positive clock edge to the next negative clock edge), during functional operation any timing constraints are easily met even at very high frequencies because of the absence of logic on the path. The timing paths from the latches to the $D_{out}$ flip-flop are full cycle paths (from a positive clock edge to the next positive clock edge), and therefore there are no timing issues on those paths either.

In addition, as noted above, both AC and DC scan chain testing are performed. Full-frequency capture cycles during AC scan chain testing allow testing of the paths from the $D_{in}$ flip-flop to the $D_{out}$ flip-flop without timing issues.

Figure 5:
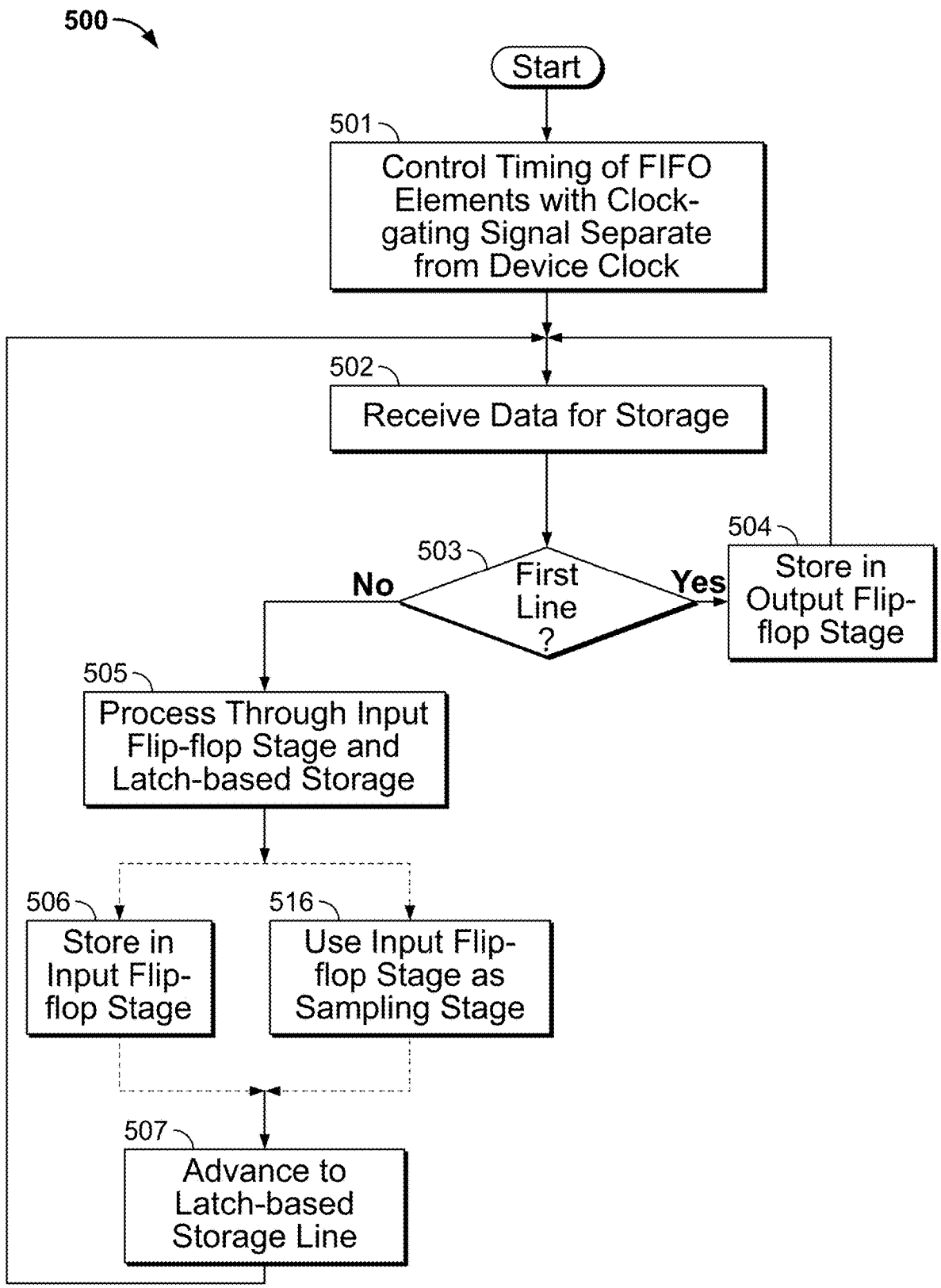
FIG. 5 is a flow diagram of a method according to implementations of the subject matter of this disclosure for operating a FIFO buffer.

An example of a method 500 of operating a hybrid FIFO according to any of the foregoing implementations is diagrammed in FIG. 5. At 501, timing of the latch-based FIFO storage line or lines, the input flip-flop stage, and the output flip-flop stage is controlled with a clock-gating signal separate from the device clock. At 502, data is received for storage in the FIFO buffer, and at 503 it is determined whether the data received is the first data line to be stored in the FIFO buffer. If so (i.e., the FIFO buffer is empty), then at 504 the initial FIFO storage line is stored in the output flip-flop stage, and flow returns to 502 to await a further data line for storage in the FIFO buffer.

When such a further data line is received at 502 for storage in the FIFO buffer, and it is determined at 503 that the data line is not the first data line to be stored in the FIFO buffer, then at 505 the received data line is processed through the input flip-flop stage. As one option, at 506, the further FIFO storage line is stored in the input flip-flop stage. Alternatively, at 516, the input flip-flop stage is used as a sampling stage for the further FIFO storage line. Either way, at 507, the data is subsequently advanced from the input flip-flop stage to the latch-based FIFO storage, and flow returns to 502 to await a further data line for storage in the FIFO buffer.

Thus it is seen that a hybrid FIFO buffer that uses latches for at least some of the FIFO storage lines, but uses flip-flops for others of the FIFO storage lines, thereby mitigating timing and scanning issues without unnecessarily increasing device area and power consumption, has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A first-in/first-out (FIFO) buffer for use in a device having a device clock, the FIFO buffer comprising:
   at least one latch-based FIFO storage line;
   an input flip-flop stage upstream of the at least one latch-based FIFO storage line;
   an output flip-flop stage downstream of the at least one latch-based FIFO storage line, the output flip-flop stage being configured to function as a first additional FIFO storage line; and
   clock-gating circuitry separate from the device clock, and configured to control timing of the at least one latch-based FIFO storage line, the input flip-flop stage, and the output flip-flop stage.

2. The FIFO buffer of claim 1 wherein the input flip-flop stage is configured to function as a second additional FIFO storage line.

3. The FIFO buffer of claim 1 wherein the input flip-flop stage is configured to function as an input sampling stage.

4. The FIFO buffer of claim 1 further comprising:
   bypass circuitry between the input flip-flop stage and the output flip-flop stage, the bypass circuitry being configured to pass data for a FIFO storage line directly to the output flip-flop stage, without passing through the at least one latch-based storage line, when the FIFO buffer is empty.

5. The FIFO buffer of claim 4 wherein the bypass circuitry comprises logic configured to determine when to pass data for a FIFO storage line directly to the output flip-flop stage, without passing through the at least one latch-based storage line, when the FIFO buffer is empty.

6. The FIFO buffer of claim 5 wherein the logic configured to determine when to pass data for a FIFO storage line directly to the output flip-flop stage when the FIFO buffer is empty comprises a multiplexer controlled by a signal that indicates a fill level of the FIFO buffer.

7. The FIFO buffer of claim 1 wherein:
   each FIFO storage line comprises a first number count of bits; and
   each of the at least one latch-based FIFO storage line comprises a second number count of single-bit latches, the second number count being equal to the first number count.

8. The FIFO buffer of claim 1 wherein clock-gating circuitry configured to control timing of the at least one latch-based FIFO storage line, the input flip-flop stage, and the output flip-flop stage is configured to control timing of the at least one latch-based FIFO storage line, the input flip-flop stage, and the output flip-flop stage based on a combination of signals including at least one of a signal indicating whether the FIFO buffer is full, a signal indicating whether a subsequent FIFO buffer is ready to receive data, and a signal indicating whether a previous FIFO buffer is ready to send data.

9. The FIFO buffer of claim 8 wherein the clock-gating circuitry is configured to control timing of the output flip-flop stage based on at least the signal indicating whether the subsequent FIFO buffer is ready to receive data.

10. The FIFO buffer of claim 8 wherein the clock-gating circuitry is configured to control timing of the input flip-flop stage based on a combination of at least the signal indicating whether the FIFO buffer is full and the signal indicating whether a previous FIFO buffer is ready to send data.

11. The FIFO buffer of claim 8 wherein the clock-gating circuitry is configured to control timing of the at least one latch-based FIFO storage line based on a combination of signals including at least the signal indicating whether the FIFO buffer is full, the signal indicating whether a subsequent FIFO buffer is ready to receive data, and the signal indicating whether a previous FIFO buffer is ready to send data.

12. The FIFO buffer of claim 8 further comprising write pointer circuitry and read pointer circuitry configured to determine location of data in the at least one latch-based storage line.

13. The FIFO buffer of claim 12 further comprising a latch-select multiplexer controlled by the read pointer.

14. The FIFO buffer of claim 8 further comprising:
   bypass circuitry between the input flip-flop stage and the output flip-flop stage, the bypass circuitry being configured to pass data for a FIFO storage line directly to the output flip-flop stage, without passing through the at least one latch-based storage line, when the FIFO buffer is empty.

15. The FIFO buffer of claim 14 wherein the bypass circuitry comprises logic configured to determine when to pass data for a FIFO storage line directly to the output flip-flop stage, without passing through the at least one latch-based storage line, when the FIFO buffer is empty.

16. The FIFO buffer of claim 15 wherein the logic configured to determine when to pass data for a FIFO storage line directly to the output flip-flop stage when the FIFO buffer is empty comprises a multiplexer controlled by a signal that indicates a fill level of the FIFO buffer.

17. A method of operating a first-in/first-out (FIFO) buffer for use in a device having a device clock, the FIFO buffer including at least one latch-based FIFO storage line, an input flip-flop stage upstream of the at least one latch-based FIFO storage line, and an output flip-flop stage downstream of the at least one latch-based FIFO storage line, the method comprising:
   controlling timing of the at least one latch-based FIFO storage line, the input flip-flop stage, and the output flip-flop stage with a clock-gating signal separate from the device clock; and
   when the FIFO buffer is empty, storing an initial FIFO storage line in the output flip-flop stage.

18. The method of claim 17 wherein the storing an initial FIFO storage line in the output flip-flop stage comprises bypassing the input flip-flop stage and the at least one latch-based FIFO storage line.

19. The method of claim 17 wherein the controlling timing of the at least one latch-based FIFO storage line, the input flip-flop stage, and the output flip-flop stage with a clock-gating signal separate from the device clock comprises controlling timing of the at least one latch-based FIFO storage line, the input flip-flop stage, and the output flip-flop stage based on a combination of signals including at least one of a signal indicating whether the FIFO buffer is full, a signal indicating whether a subsequent FIFO buffer is ready to receive data, and a signal indicating whether a previous FIFO buffer is ready to send data.

20. The method of claim 19 wherein controlling timing of the output flip-flop stage comprises controlling timing of the output flip-flop stage based on at least the signal indicating whether the subsequent FIFO buffer is ready to receive data.

21. The method of claim 19 wherein controlling timing of the input flip-flop stage comprises controlling timing of the input flip-flop stage based on a combination of at least the signal indicating whether the FIFO buffer is full and the signal indicating whether a previous FIFO buffer is ready to send data.

22. The method of claim 19 wherein controlling timing of the at least one latch-based FIFO storage line comprises controlling timing of the at least one latch-based FIFO storage line based on a combination of signals including at least the signal indicating whether the FIFO buffer is full, the signal indicating whether a subsequent FIFO buffer is ready to receive data, and the signal indicating whether a previous FIFO buffer is ready to send data.

* * * * *